(12) United States Patent
Kawamura et al.

(10) Patent No.: US 11,322,574 B2
(45) Date of Patent: May 3, 2022

(54) DISPLAY DEVICE

(71) Applicant: SHARP KABUSHIKI KAISHA, Sakai (JP)

(72) Inventors: Takehiko Kawamura, Sakai (JP); Junichi Yamada, Sakai (JP); Makoto Yokoyama, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 43 days.

(21) Appl. No.: 17/043,945

(22) PCT Filed: Apr. 12, 2018

(86) PCT No.: PCT/JP2018/015413
§ 371 (c)(1),
(2) Date: Sep. 30, 2020

(87) PCT Pub. No.: WO2019/198204
PCT Pub. Date: Oct. 17, 2019

(65) Prior Publication Data
US 2021/0098560 A1 Apr. 1, 2021

(51) Int. Cl.
*G09G 3/30* (2006.01)
*H01L 27/32* (2006.01)
(Continued)

(52) U.S. Cl.
CPC ....... *H01L 27/3276* (2013.01); *G09G 3/3648* (2013.01); *H01L 51/0097* (2013.01); *H01L 2251/5338* (2013.01)

(58) Field of Classification Search
CPC ..... G09F 9/00; G09F 9/30; G09G 2300/0426; G09G 2300/0819; G09G 2300/0842;
(Continued)

(56) References Cited
U.S. PATENT DOCUMENTS

2009/0102758 A1  4/2009  Anzai et al.
2014/0253419 A1  9/2014  Tanada
(Continued)

FOREIGN PATENT DOCUMENTS

JP  2009-122636 A   6/2009
JP  2014-197179 A  10/2014
(Continued)

*Primary Examiner* — Insa Sadio
(74) *Attorney, Agent, or Firm* — ScienBiziP, P.C.

(57) ABSTRACT

A display device including: a driver outside a display area; a special-shape portion on an edge of the display area, the special-shape portion being shaped like a line that is curved or oblique to an extension direction of signal lines in the display area; a plurality of first-type circuit blocks outside the special-shape portion, each of the first-type circuit blocks including a unit circuit for the driver in a rectangular region having a first side parallel to the extension direction and a second side perpendicular to, and shorter than, the first side; and a plurality of second-type circuit blocks outside the special-shape portion, each of the second-type circuit blocks including a unit circuit for the driver in a rectangular region obtained by rotating the previous rectangular region by 90°.

20 Claims, 13 Drawing Sheets

(51) Int. Cl.
*G09G 3/36* (2006.01)
*H01L 51/00* (2006.01)

(58) Field of Classification Search
CPC ... G09G 2300/0861; G09G 2310/0281; G09G 3/3233; G09G 3/3258; G09G 3/3648; H01L 2251/5338; H01L 27/3276; H01L 51/0097
See application file for complete search history.

(56) References Cited

U.S. PATENT DOCUMENTS

| | | | |
|---|---|---|---|
| 2014/0354612 A1* | 12/2014 | Okamoto | G06F 3/0412 345/204 |
| 2015/0362812 A1 | 12/2015 | Aoki et al. | |
| 2017/0178563 A1 | 6/2017 | Anzai et al. | |
| 2018/0003880 A1 | 1/2018 | Aoki et al. | |
| 2018/0040680 A1* | 2/2018 | Cai | H01L 51/0097 |
| 2018/0040683 A1 | 2/2018 | Matsueda et al. | |

FOREIGN PATENT DOCUMENTS

| | | |
|---|---|---|
| JP | 2016-004071 A | 1/2016 |
| JP | 2018-022117 A | 2/2018 |

* cited by examiner

DISPLAY DEVICE

TECHNICAL FIELD

The disclosure relates to display devices.

BACKGROUND ART

Patent Literature 1 discloses technology for arranging driver unit circuits outside a curved edge of a display section (i.e., in a non-display section).

CITATION LIST

Patent Literature

Patent Literature 1: Japanese Unexamined Patent Application Publication, Tokukai, No. 2009-122636

SUMMARY

Technical Problem

Conventional techniques entail an undesirable increase in the area of the non-display section (frame section).

Solution to Problem

The disclosure, in an aspect thereof, is directed to a display device including: a driver outside a display area; a special-shape portion on an edge of the display area, the special-shape portion being shaped like a line that is curved or oblique to an extension direction of signal lines in the display area; a plurality of first-type circuit blocks outside the special-shape portion, each of the first-type circuit blocks including a unit circuit for the driver in a rectangular region having a first side parallel to the extension direction and a second side perpendicular to, and shorter than, the first side; and a plurality of second-type circuit blocks outside the special-shape portion, each of the second-type circuit blocks including a unit circuit for the driver in a rectangular region obtained by rotating the previous rectangular region by 90°.

Advantageous Effects of Disclosure

The disclosure, in an aspect thereof, is capable of reducing the frame area of a display device with a specially shaped display section and restraining circuit elements from having properties that vary from one unit circuit to the other.

DESCRIPTION OF EMBODIMENTS

Throughout the following description, expressions like "component A is in the same layer as component B" indicate that components A and B are formed in the same process or step, expressions like "component A underlies/is below component B" indicate that component A is formed in an earlier process or step than component B, and expressions like "component A overlies/is on or above component B" indicate that component A is formed in a later process or step than component B.

Figure 1:
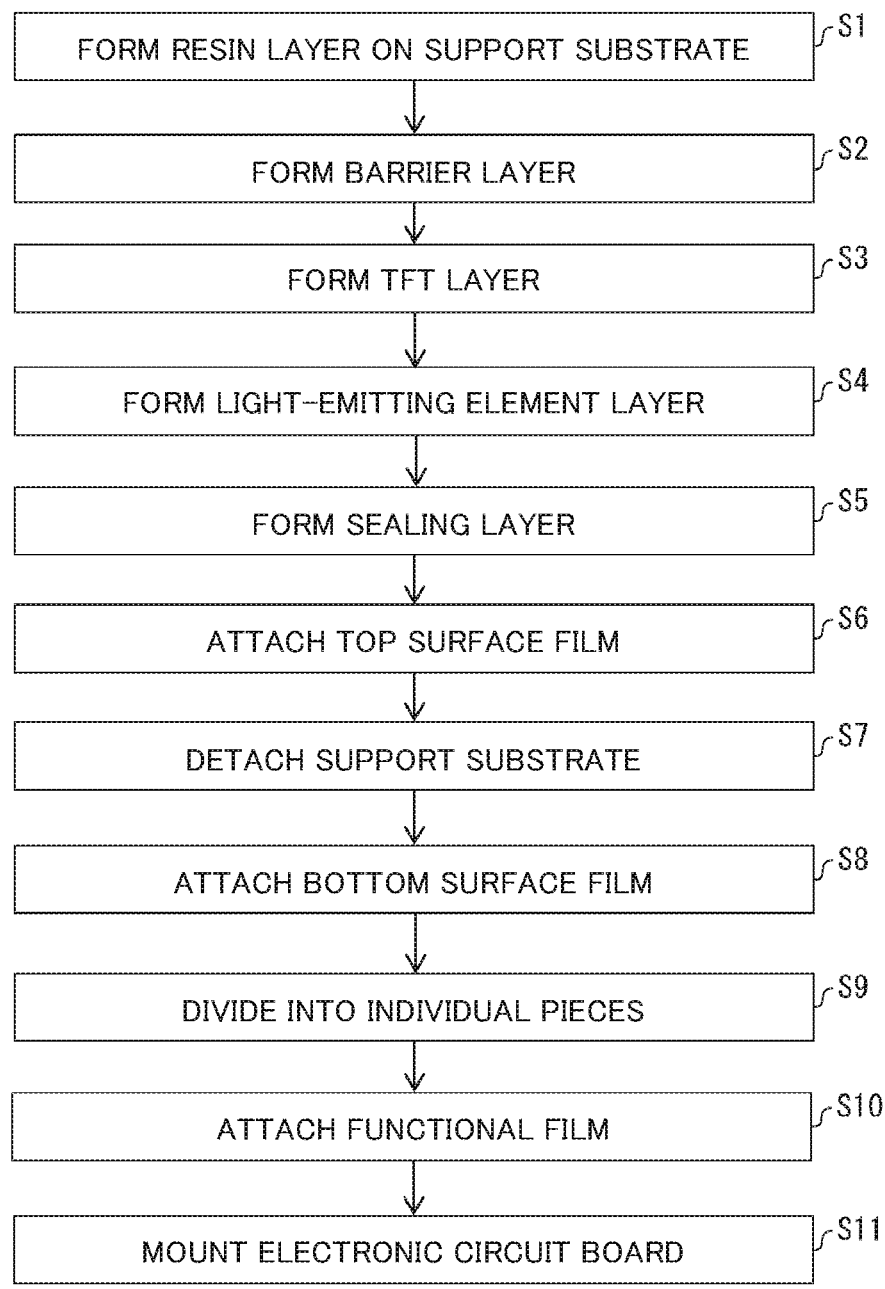
FIG. 1 is a flow chart representing an exemplary method of manufacturing a display device.
Figure 2:
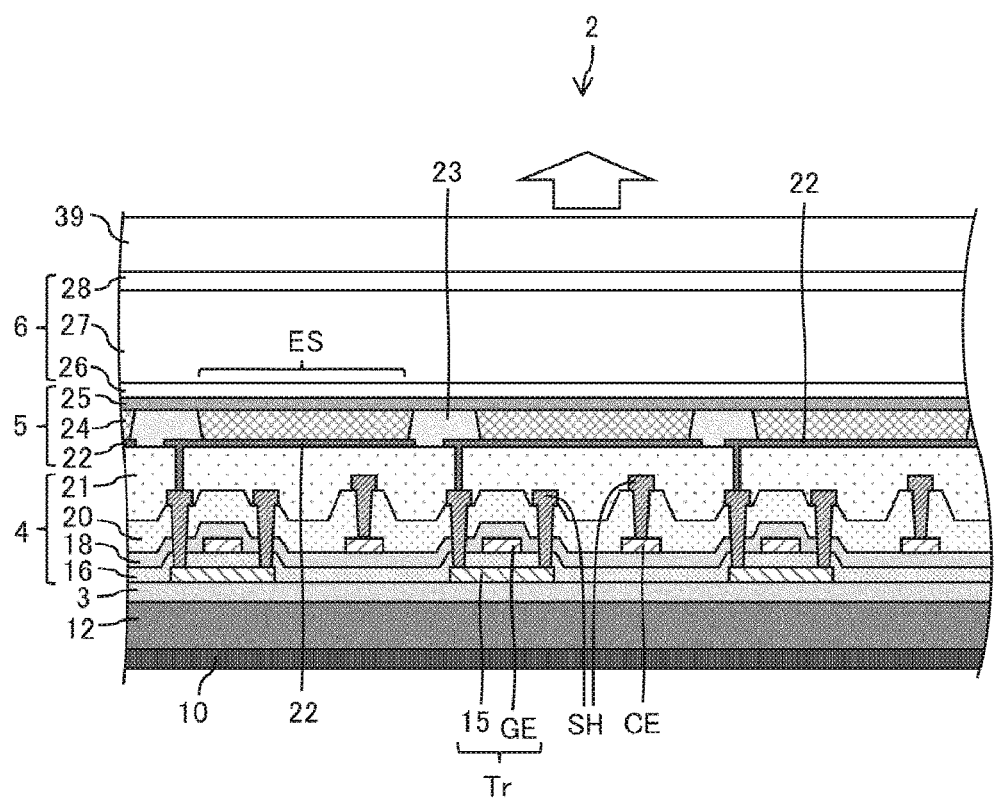
FIG. 2 is a cross-sectional view of an exemplary structure of a display section of the display device.
Figure 3:
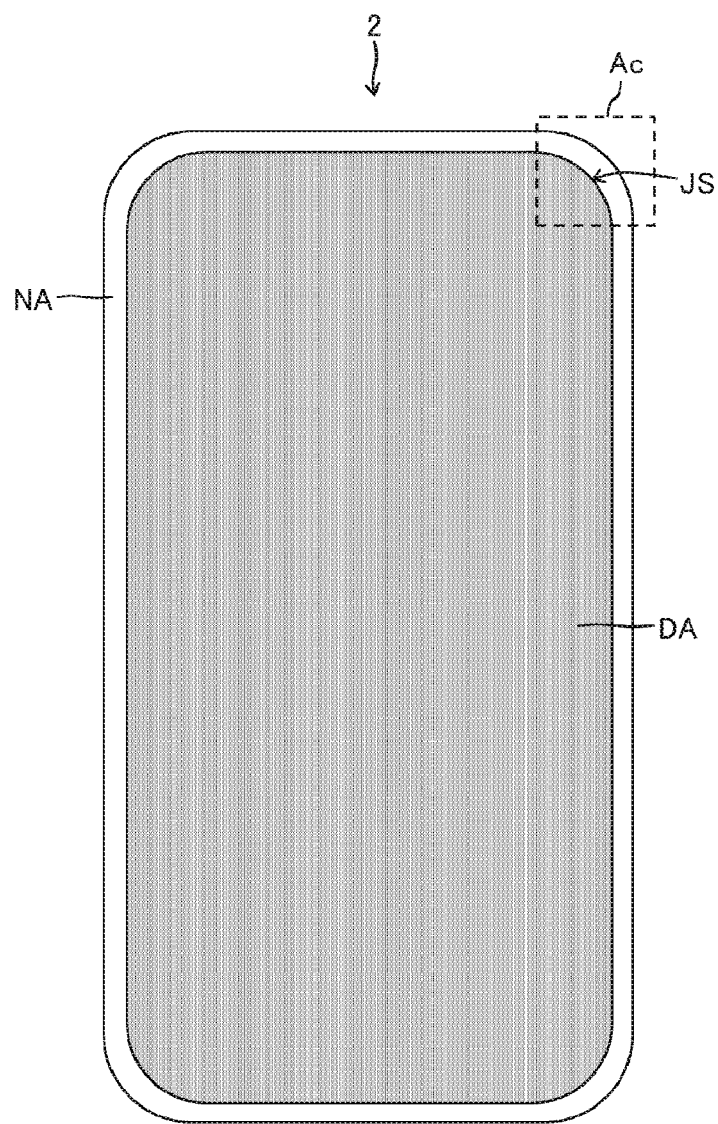
FIG. 3 is a plan view of an exemplary structure of the display device.

FIG. 1 is a flow chart representing an exemplary method of manufacturing a display device 2. FIG. 2 is a cross-sectional view of a display section of the display device. FIG. 3 is a plan view of a structure of the display device.

To manufacture a flexible display device, as shown in FIGS. 1 to 3, a resin layer 12 is first provided on a transparent support substrate (e.g., mother glass) (step S1). A barrier layer 3 is then provided (step S2). Next, a TFT layer 4 is provided (step S3). Next, a top-emission light-emitting element layer (e.g., an OLED layer) 5 is provided (step S4). Next, a sealing layer 6 is provided (step S5). Next, a top surface film is attached to the sealing layer 6 (step S6).

Next, the bottom surface of the resin layer 12 is irradiated with a laser beam via the support substrate to reduce binding force between the support substrate and the resin layer 12 so that the support substrate can be detached from the resin layer 12 (step S7). Next, a bottom surface film 10 is attached to the bottom surface of the resin layer 12 (step S8). Next, a laminate including the bottom surface film 10, the resin layer 12, the barrier layer 3, the TFT layer 4, the light-emitting element layer 5, and the sealing layer 6 is divided into a plurality of individual pieces (step S9). Next, a functional film 39 is attached to the obtained individual pieces (step S10). Next, an electronic circuit board (e.g., IC chip) is mounted to a frame area NA outside a display area DA (see FIG. 3) (step S11).

The resin layer 12 is made of, for example, polyimide. The bottom surface film 10 is made of, for example, polyethylene terephthalate (PET).

The barrier layer 3 prevents foreign objects such as water and oxygen from reaching the TFT layer 4 and the light-emitting element layer 5. The barrier layer 3 may include, for example, a silicon oxide film, a silicon nitride film, a silicon oxynitride film, or a stack of such films. These films can be formed by CVD.

The TFT layer 4 includes: a semiconductor film 15; an inorganic insulating film 16 (gate insulating film) overlying the semiconductor film 15; a gate electrode GE overlying the inorganic insulating film 16; an inorganic insulating film 18 overlying the gate electrode GE; a capacitor electrode CE overlying the inorganic insulating film 18; an inorganic insulating film 20 overlying the capacitor electrode CE; a source line SH overlying the inorganic insulating film 20; and a planarization film 21 (interlayer insulating film) overlying the source line SH.

The semiconductor film 15 is made of, for example, a low-temperature polysilicon (LTPS) or an oxide semiconductor. A thin film transistor Tr (TFT) is structured to include the semiconductor film 15, the inorganic insulating film 16, and the gate electrode GE. FIG. 2 shows a top-gate thin film transistor Tr. The TFT Tr may alternatively have a bottom-gate structure.

The gate electrode GE, the capacitor electrode CE, and the source line SH are made of, for example, a monolayer film of at least one of metals of aluminum (Al), tungsten (W), molybdenum (Mo), tantalum (Ta), chromium (Cr), titanium (Ti), and copper (Cu) or a stack of such films.

The inorganic insulating films 16, 18, and 20 may be made of, for example, a silicon oxide (SiOx) film or a silicon nitride (SiNx) film formed by, for example, CVD or a stack of such films. The planarization film 21 may be made of, for example, a photosensitive organic material, such as polyimide or acrylic, that can be provided by coating.

The light-emitting element layer 5 (e.g., organic light-emitting diode layer) includes: an anode 22 overlying the planarization film 21; an electrically insulating anode cover film 23 covering an edge of the anode 22; an EL (electroluminescence) layer 24 overlying the anode 22; and a cathode 25 overlying the EL layer 24. A subpixel circuit includes a light-emitting element ES and a control circuit for controlling the light-emitting element ES. The light-emitting element ES (e.g., OLED or organic light-emitting diode) includes the insular anode 22, the EL layer 24, and the cathode 25. The anode cover film 23 may be made of, for example, a photosensitive organic material, such as polyimide or acrylic, that can be provided by coating.

The EL layer 24 includes, for example, a stack of a hole injection layer, a hole transport layer, a light-emitting layer, an electron transport layer, and an electron injection layer that are provided in this sequence on an underlying layer. An insular light-emitting layer is formed for each subpixel by vapor deposition or inkjet technology. The other layers are formed insular or provided as common layers for all the subpixels (common layers). One or more of the hole injection layer, the hole transport layer, the electron transport layer, and the electron injection layer may be omitted.

The anode 22 includes, for example, a stack of ITO (indium tin oxide) and either Ag (silver) or a Ag-containing alloy and is light-reflective. The cathode 25 may be made of a transparent, electrically conducting material such as Mg/Ag alloy (super thin film), ITO (indium tin oxide), or IZO (indium zinc oxide).

If the light-emitting element layer 5 is an OLED layer, holes and electrons recombine in the EL layer 24 owing to the drive current flowing between the anode 22 and the cathode 25, to produce excitons that fall to the ground state to emit light. Since the cathode 25 is transparent, and the anode 22 is light-reflective, the light emitted by the EL layer 24 travels upwards, thereby achieving "top emission."

The light-emitting element layer 5 is not necessarily a part of an OLED element and may alternatively be a part of an inorganic light-emitting diode or a part of a quantum dot light-emitting diode.

The sealing layer 6 is transparent and includes: an inorganic sealing film 26 covering the cathode 25; an organic sealing film 27 overlying the inorganic sealing film 26; and an inorganic sealing film 28 overlying the organic sealing film 27. The sealing layer 6 covering the light-emitting element layer 5 prevents foreign objects such as water and oxygen from reaching the light-emitting element layer 5.

The inorganic sealing film 26 and the inorganic sealing film 28 may include, for example, a silicon oxide film, a silicon nitride film, a silicon oxynitride film, or a stack of such films. These films can be formed by CVD. The organic sealing film 27 is a transparent organic film with a planarization effect and can be made of an organic material, such as acrylic, that can be provided by coating.

The bottom surface film 10 imparts excellent flexibility to the display device when attached to a bottom surface of the resin layer 12 after the support substrate is detached. The bottom surface film 10 is made of, for example, PET. The functional film 39 has, for example, an optical compensation function, a touch sensor function, and a protection function.

The description has so far discussed the manufacture of a flexible display device. To manufacture a non-flexible display device, the process proceeds, for example, from step S5 to step S9 in FIG. 1 because it is not necessary, for example, to replace the substrate.

Embodiment 1

Figure 4:
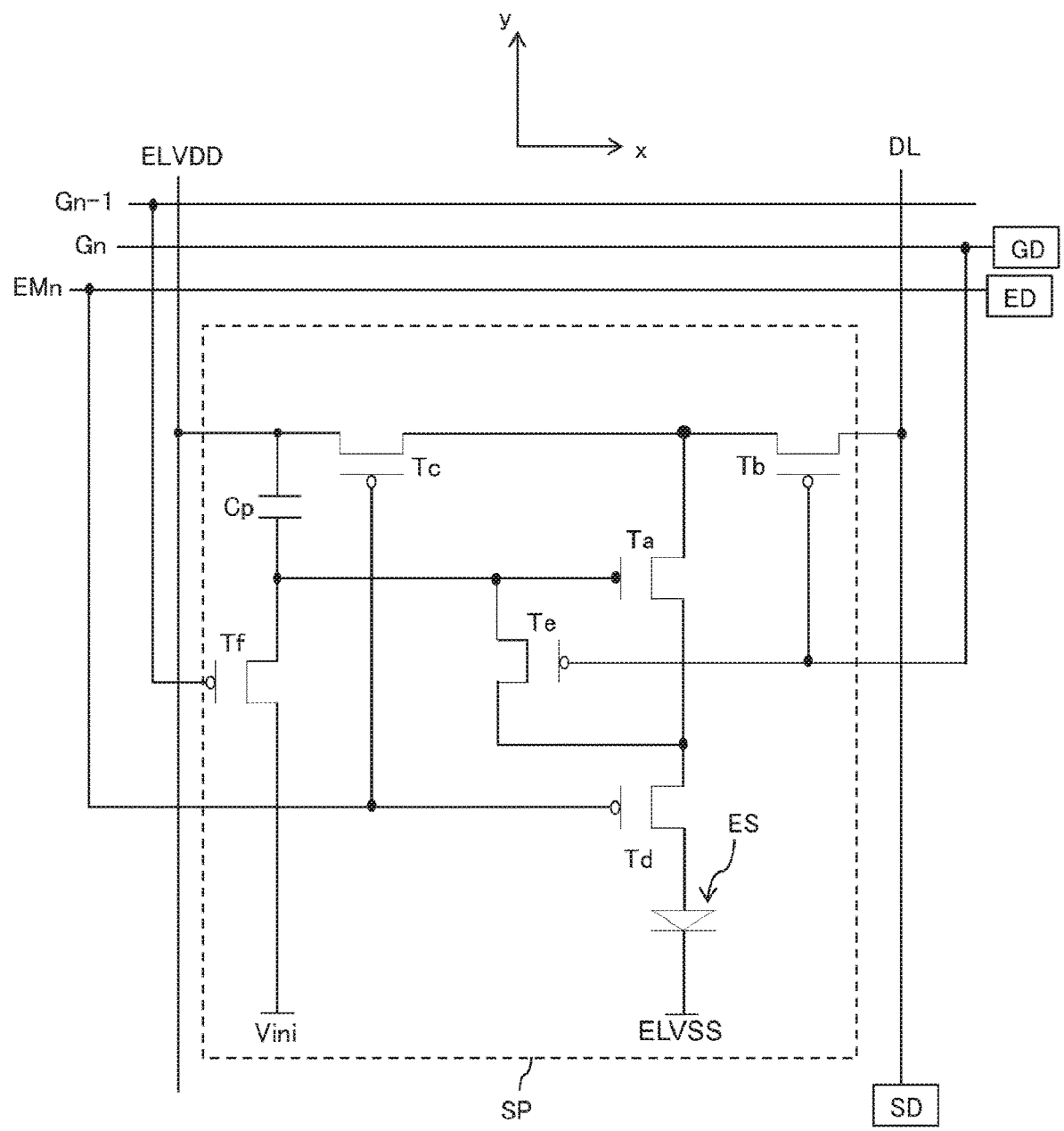
FIG. 4 is a circuit diagram of an exemplary subpixel in a display area.

FIG. 4 is a circuit diagram of an exemplary subpixel in a display area DA. The TFT layer 4 in FIG. 2 includes scan signal lines Gn−1 and Gn and a light-emission signal line EMn all extending in the x-direction (row direction) and a data signal line DL extending in the y-direction (column direction). A subpixel circuit SP is provided in the TFT layer 4 in FIG. 2 and includes a driver transistor Ta, a switching transistor Tb, a power supply control transistor Tc, a light emission control transistor Td, a threshold voltage compensation transistor Te, an initialization transistor Tf, a capacitor Cp, and the light-emitting element ES (e.g., organic light-emitting diode) provided in the light-emitting element layer 5 shown in FIG. 2. In the subpixel circuit SP, the switching transistor Tb is connected to the scan signal line Gn and the data signal line DL. As the scan signal line Gn goes active, the data signal line DL supplies an electrical potential signal to the subpixel SP in accordance with display gray level data. As the light-emission signal line EMn goes active, the light-emitting element ES emits light with luminance that is in accordance with the display gray level data. The scan signal lines Gn−1 and Gn are connected to a scan signal line driver GD. The light-emission signal line EMn is connected to a light-emission signal line driver ED. The data signal line DL is connected to a data signal line driver SD. The data signal line driver SD may be a driver for a time division driving scheme (SSD) provided in the same layer as the TFT layer 4.

FIG. 5(a) is a plan view of a corner portion (Ac) of a display device in accordance with Example 1. FIG. 5(b) is a plan view of a circuit block. Referring to FIG. 5(a), the display area DA has an edge a part of which (corner portion) forms a special-shape portion JS shaped like an externally convex, curved line. The scan signal line driver GD, formed by the same process (in the same layer) as the TFT layer 4 (including a subpixel circuit) shown in FIG. 2, is disposed outside the special-shape portion JS (in a corner portion of the frame area NA).

Outside the special-shape portion JS, there is provided a plurality of first-type circuit blocks KBx each including unit circuits UC in the scan signal line driver GD in a rectangular region having a first side Fa (long side) that is parallel to the x-direction and a second side Fb (short side) that is perpendicular to the first side Fa and shorter than the first side Fa, and there is also provided a plurality of second-type circuit blocks KBy each including unit circuits UC in the scan signal line driver GD in a rectangular region obtained by rotating the previous rectangular region by 90°.

The first-type circuit blocks KBx are connected in the y-direction, thereby forming a first-type circuit unit KUx. The second-type circuit blocks KBy are connected in the x-direction, thereby forming a second-type circuit unit KUy. The first-type circuit units KUx and the second-type circuit units KUy are arranged along and outside the special-shape portion JS.

Figure 5:
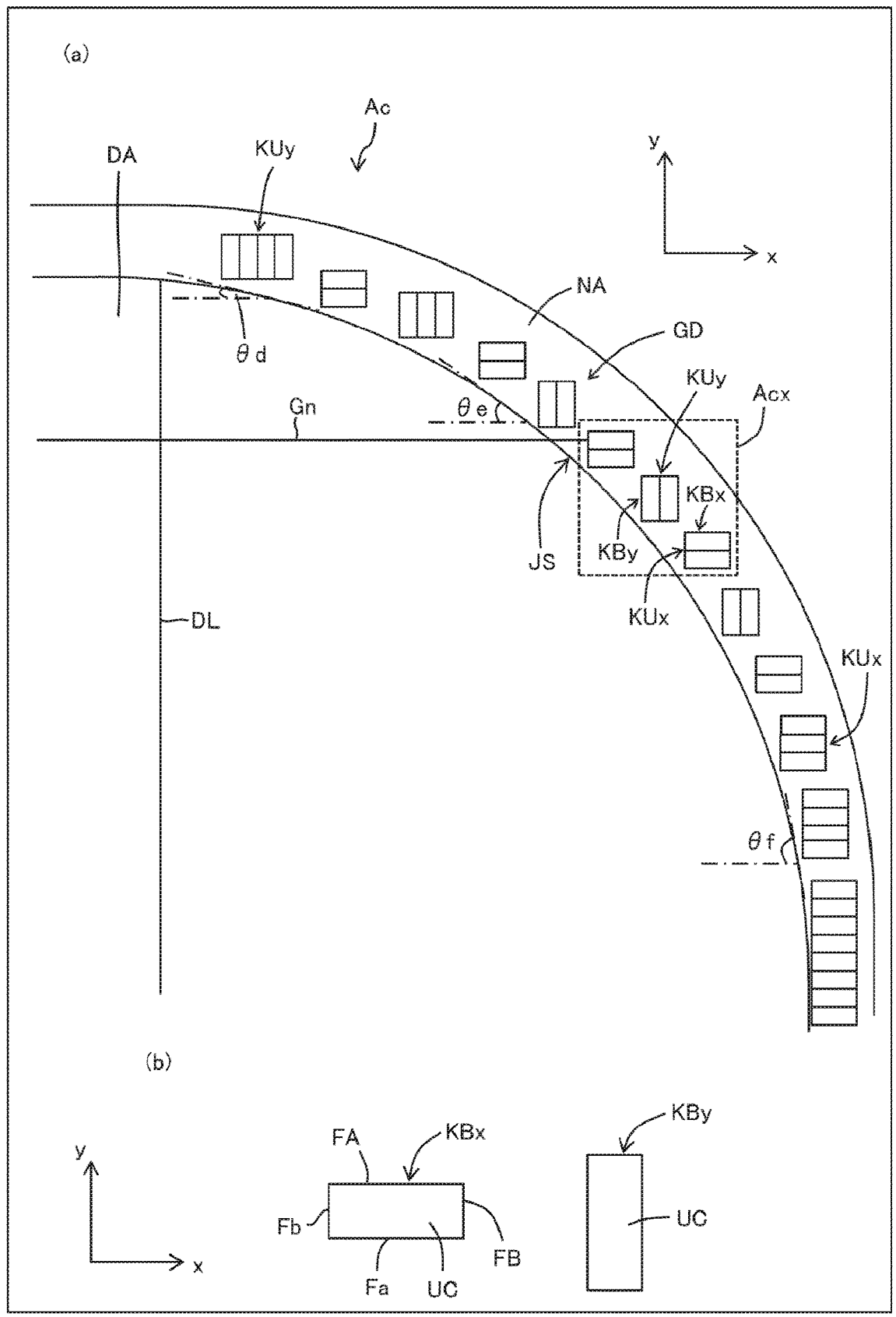
FIG. 5(a) is a plan view of a corner portion of a display device in accordance with Example 1.
FIG. 5(b) is a plan view of a circuit block.

In FIG. 5, the scan signal line driver GD includes a plurality of unit circuits each of which is electrically connected to a single scan signal line (one row) to output a scan signal to that scan signal line. The first-type circuit block KBx is a unit circuit disposed in the landscape position (so as to have a long side thereof parallel to the x-direction) in FIG. 5. The second-type circuit block KBy is a unit circuit disposed in the portrait position (so as to have a long side thereof parallel to the y-direction) in FIG. 5. The first-type circuit unit KUx is a longitudinal (y-directional) string of first-type circuit blocks KBx. The second-type circuit unit KUy is a transverse (x-directional) string of second-type circuit blocks KBy.

FIG. 6(a) is a circuit diagram of a scan signal line driver. FIG. 6(b) is a timing chart illustrating the operation of the scan signal line driver. FIG. 6(c) is a circuit diagram of an exemplary unit circuit. FIG. 7(a) is a plan view of an exemplary structure of a scan signal line driver. FIG. 7(b) is a plan view of a first-type circuit block. FIG. 7(c) is a plan view of a second-type circuit block.

Figure 6:
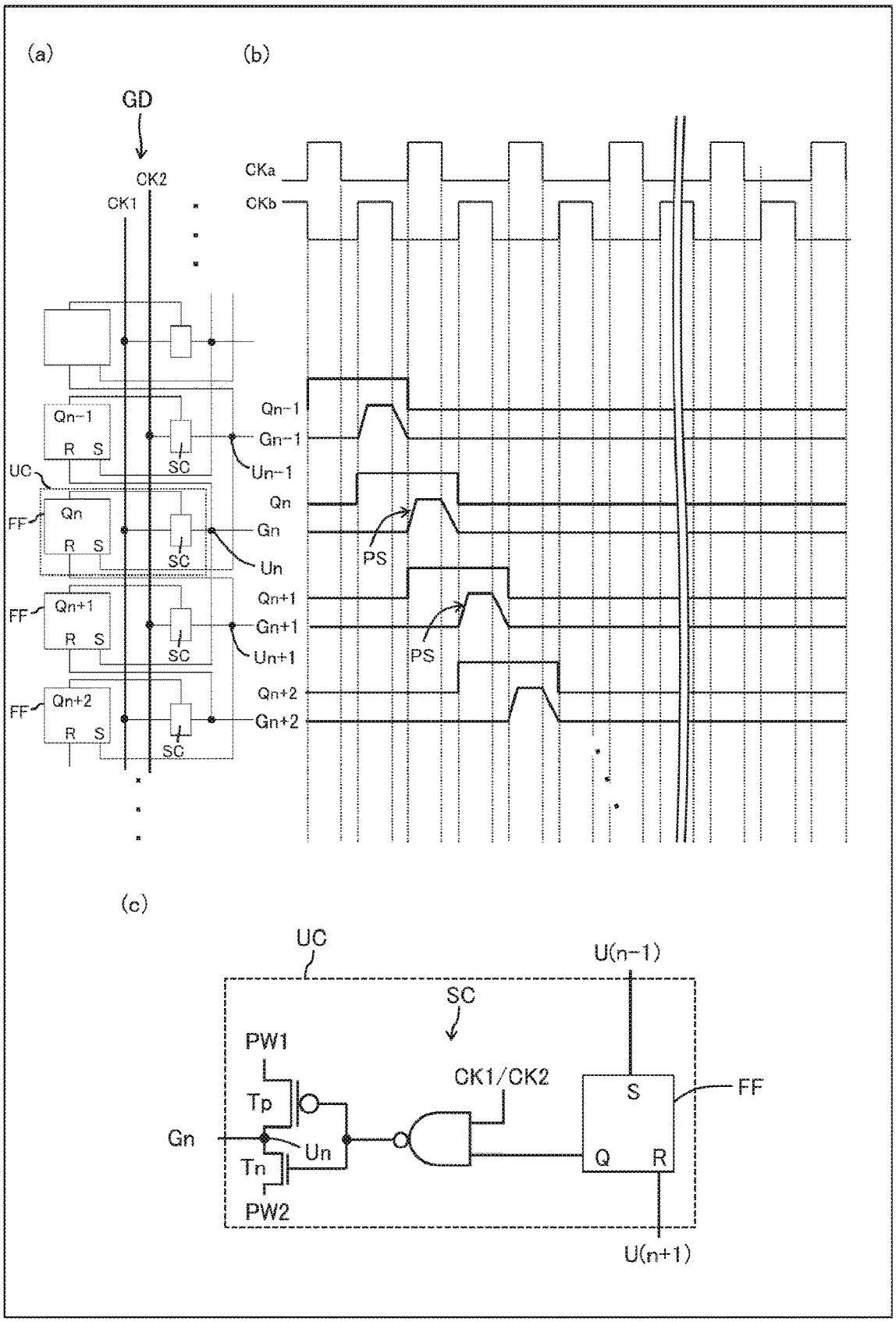
FIG. 6(a) is a circuit diagram of a scan signal line driver.
FIG. 6(b) is a timing chart illustrating the operation of the scan signal line driver.
FIG. 6(c) is a circuit diagram of a unit circuit.

Referring to FIG. 6, the scan signal line driver GD includes a plurality of mutually connected unit circuits UC. For example, the n-th unit circuit UC has an output terminal Un (see FIG. 6) connected to the n-th scan signal line Gn, to the RESET terminal R of the preceding, (n−1)-th unit circuit UC, and to the SET terminal S of the succeeding, (n+1)-th unit circuit UC. The unit circuit UC outputs a scan signal (pulse signal) PS to a scan signal line connected thereto and includes, for example, an Set-Reset-type flip-flop FF, an output circuit SC, a clock signal line CK1, a clock signal line CK2, a power supply line PW1 (for high voltage), and a power supply line PW2 (for low voltage). The clock signal line CK1 is fed with a clock signal CKa shown in FIG. 6(b), and the clock signal line CK2 is fed with a clock signal CKb shown in FIG. 6(b). The flip-flop FF and the output circuit SC are fed with a power supply voltage through the power supply lines PW1 and PW2.

Figure 7:
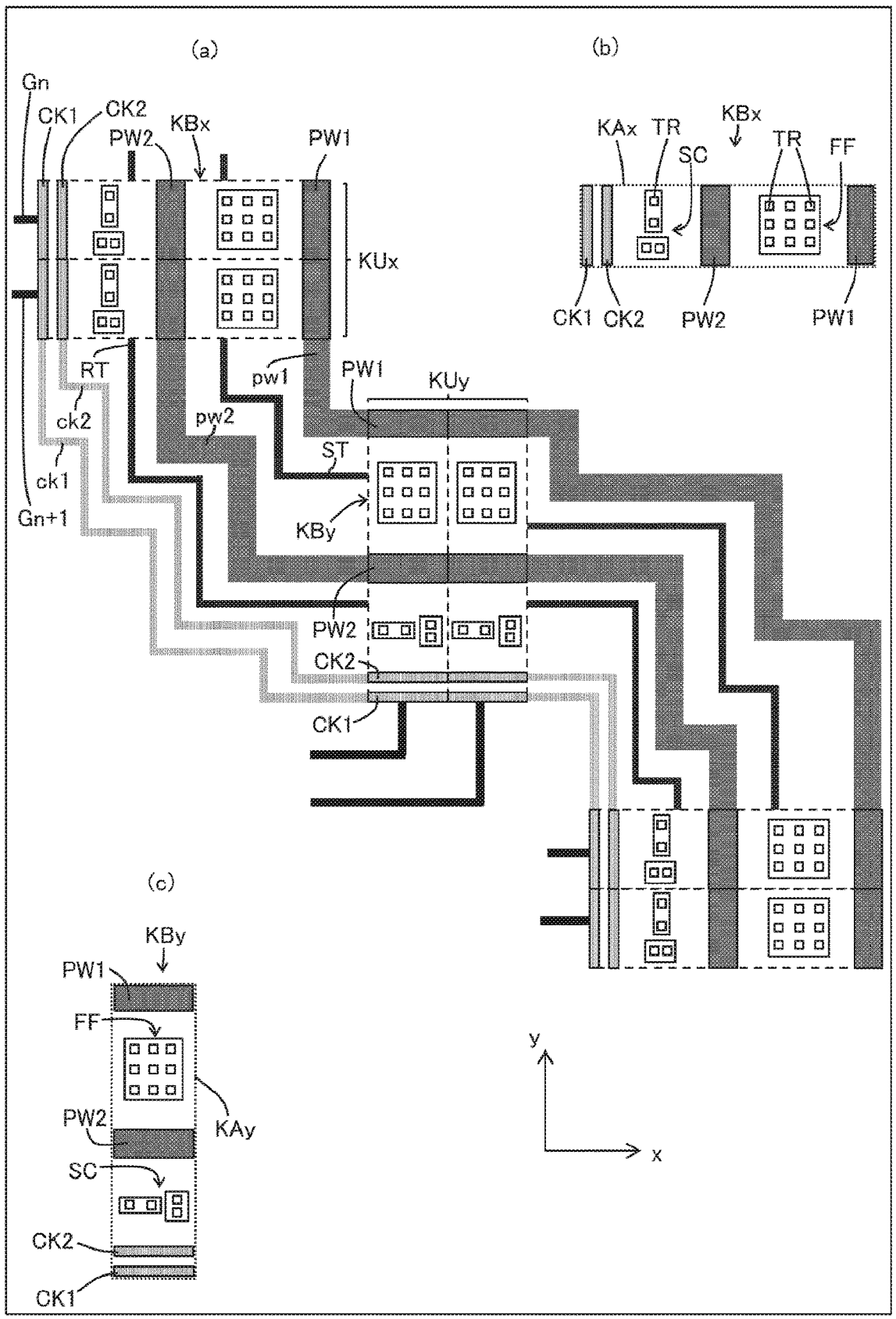
FIG. 7 is a set of plan views of interconnections between circuit units.

Referring to FIG. 7, each first-type circuit block KBx includes a clock signal line CK1 along one of the two short sides thereof, a power supply line PW1 along the other short side thereof, a power supply line PW2 between the clock signal line CK1 and the power supply line PW1 (in the middle part of the rectangular region), a clock signal line CK2 between the clock signal line CK1 and the power supply line PW2, a flip-flop FF including a plurality of transistors TR between the power supply line PW1 and the power supply line PW2, and an output circuit SC including a plurality of transistors TR between the power supply line PW2 and the clock signal line CK2. FIG. 7 shows the arrangement of the transistors TR in a mere schematic manner.

The layout (shapes and locations) of the circuit elements (e.g., transistors, capacitors, resistors, wires, and terminals) in the unit circuits UC in the second-type circuit block KBy is identical to that of the circuit elements in the unit circuits UC in the first-type circuit block KBx if the latter is rotated counterclockwise by 90°.

The unit circuit UC is provided in rectangular regions KAx and KAy (regions surrounded by dotted lines in FIGS. 7(b) and 7(c)). These rectangular regions KAx and KAy each have one of the two short sides thereof specified by the periphery of the power supply line PW1, the other short side thereof specified by the periphery of the clock signal line CK1, and the two long sides thereof, perpendicular to the clock signal line CK1 and the power supply line PW1, specified by two parallel lines sandwiching a flip-flop FF and an output circuit SC connected to this flip-flop FF.

Rectangular regions each having the long sides Fa and FA and the short sides Fb and FB (see FIG. 5(b)) are arranged next to each other in the short-side direction, and each rectangular region includes a unit circuit. In this structure, the long side Fa, which is one of the long sides Fa and FA that is positioned between adjoining unit circuits, may be specified as a side that passes through the midpoint of the outermost element of the adjoining unit circuits. The long side FA, on which there exists no adjoining unit circuit, may be specified as a side separated from the outermost element by a distance equal to the distance by which the outermost element is separated from the side on which there exists an adjoining unit circuit. The short sides Fb and FB may be specified as the outermost ones of the wires commonly pulled into the unit circuits.

The first-type circuit block KBx and the second-type circuit block KBy are connected to each other by a clock-signal-use connecting line ck1 connecting the clock signal lines CK1 thereof to each other, a clock-signal-use connecting line ck2 connecting the clock signal lines CK2 thereof to each other, a power-supply-use connecting line pw1 connecting the power supply lines PW1 thereof to each other, a power-supply-use connecting line pw2 connecting the power supply lines PW2 thereof to each other, a SET-signal-use connecting line ST for transmitting a SET signal, and a RESET-signal-use connecting line RT for transmitting a RESET signal.

The two adjoining first-type circuit blocks KBx in the circuit unit KUx are connected to each other by a SET-signal-use connecting line and a RESET-signal-use connecting line (neither shown). The two adjoining second-type circuit blocks KBy in the circuit unit KUy are connected to each other by a SET-signal-use connecting line and a RESET-signal-use connecting line (neither shown).

Embodiment 1 is capable of reducing the frame area NA outside the special-shape portion JS and restraining the circuit elements from having properties that vary from one unit circuit to the other because the unit circuits UC in the scan signal line driver reside in the first-type circuit blocks KBx and the second-type circuit blocks KBy. If the circuit blocks are arranged in a radial fashion outside the special-shape portion JS, the properties of the circuit elements can vary greatly from one unit circuit to the other.

In addition, the clock-signal-use connecting lines ck1 and ck2, the power-supply-use connecting lines pw1 and pw2, the SET-signal-use connecting line ST, and the RESET-signal-use connecting line RT are routed like stairs (a shape with 90° bends from the x-direction to the y-direction and 90° bends from the y-direction to the x-direction). This structure can further reduce the frame area NA.

Referring to FIG. 5, the circuit units KUx each including two first-type circuit blocks KBx and the circuit units KUy each including two second-type circuit blocks KBy are disposed outside a part of the special-shape portion JS that has a tangent making an acute angle in a prescribed range (e.g., a range from 30° to 60° that spans across θe) with respect to the x-direction. The circuit units KUx each including three or more first-type circuit blocks KBx and the circuit units KUy each including three or more second-type circuit blocks KBy are disposed outside a part of the special-shape portion JS that has a tangent making an acute angle outside the prescribed range (e.g., a range from 0 to 30° that spans across θd and a range from 60° to 90° that spans across θf) with respect to the x-direction. This structure allows for further reduction of the frame area NA outside the special-shape portion JS.

Outside a part of the special-shape portion JS that has a tangent making an acute angle in a prescribed range (e.g., a range from 30° to 60° that spans across θe) with respect to the x-direction, the circuit units KUx and the circuit unit KUy may be arranged alternately along the special-shape portion JS.

Figure 8:
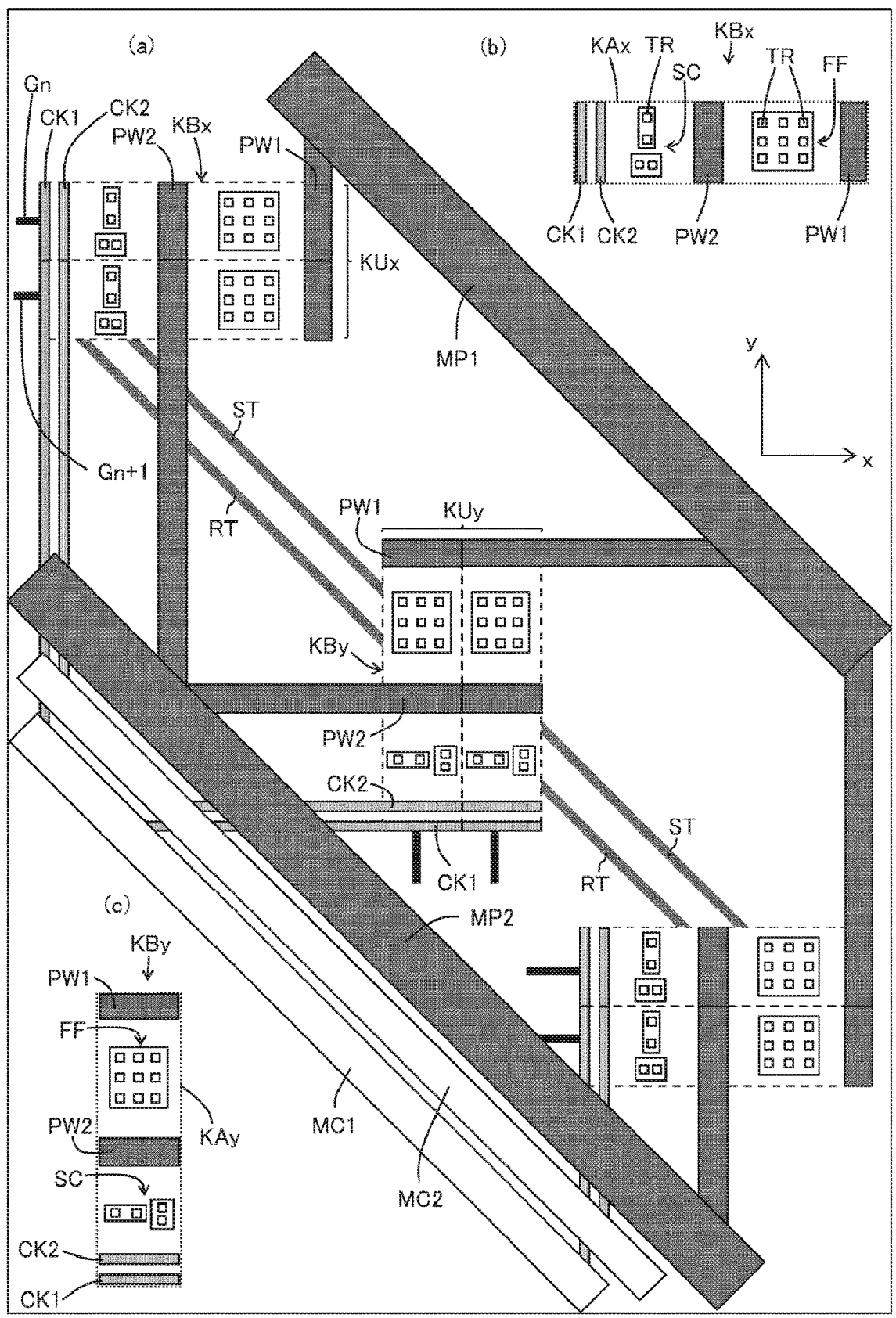
FIG. 8 is a set of plan views of other exemplary interconnections between circuit units.

FIG. 8 is a set of plan views of other exemplary interconnections between unit circuits. There is provided a power supply main line MP1 outside the first-type circuit units KUx and the second-type circuit units KUy. Inside the first-type circuit units KUx and the second-type circuit units KUy, there are provided a power supply main line MP2, a clock main line MC2, and a clock main line MC1 in this sequence as viewed from the outside toward the inside, the clock signal line CK1 is connected to the clock main line MC1, the clock signal line CK2 is connected to the clock main line MC2, the power supply line PW1 is connected to the power supply main line MP1, and the power supply line PW2 is connected to the power supply main line MP2. The first-type circuit blocks KBx and the second-type circuit blocks KBy are connected by the SET-signal-use connecting line ST that is routed like stairs to transmit SET signals and the RESET-signal-use connecting line RT.

The provision shown in FIG. 8 of the power supply main lines MP1 and MP2 and the clock main lines MC1 and MC2, which are all shaped like a curved line or like an oblique line, reduces the lengths of transmission paths for the clock signals CKa and CKb shown in FIG. 6(b) and the power supply voltages, thereby alleviating transmission load.

The increase in the width of the power supply main lines MP1 and MP2 and the clock main lines MC1 and MC2 by using the stair-like regions formed between the first-type circuit blocks KBx and the second-type circuit blocks KBy can reduce the resistance of these lines, thereby alleviating transmission load.

Figure 9:
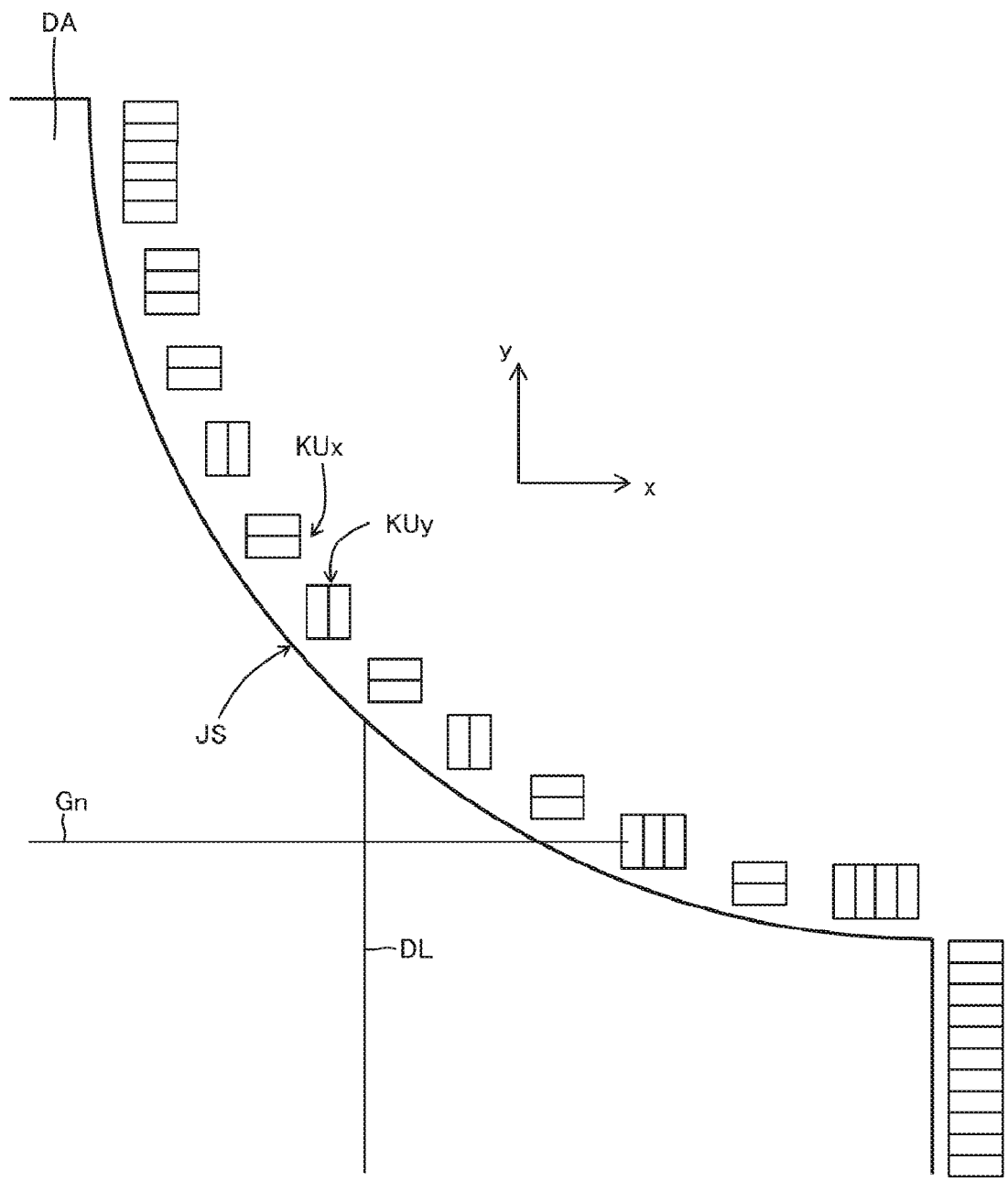
FIG. 9 is a plan view of a variation example of a corner portion of the display device.
Figure 10:
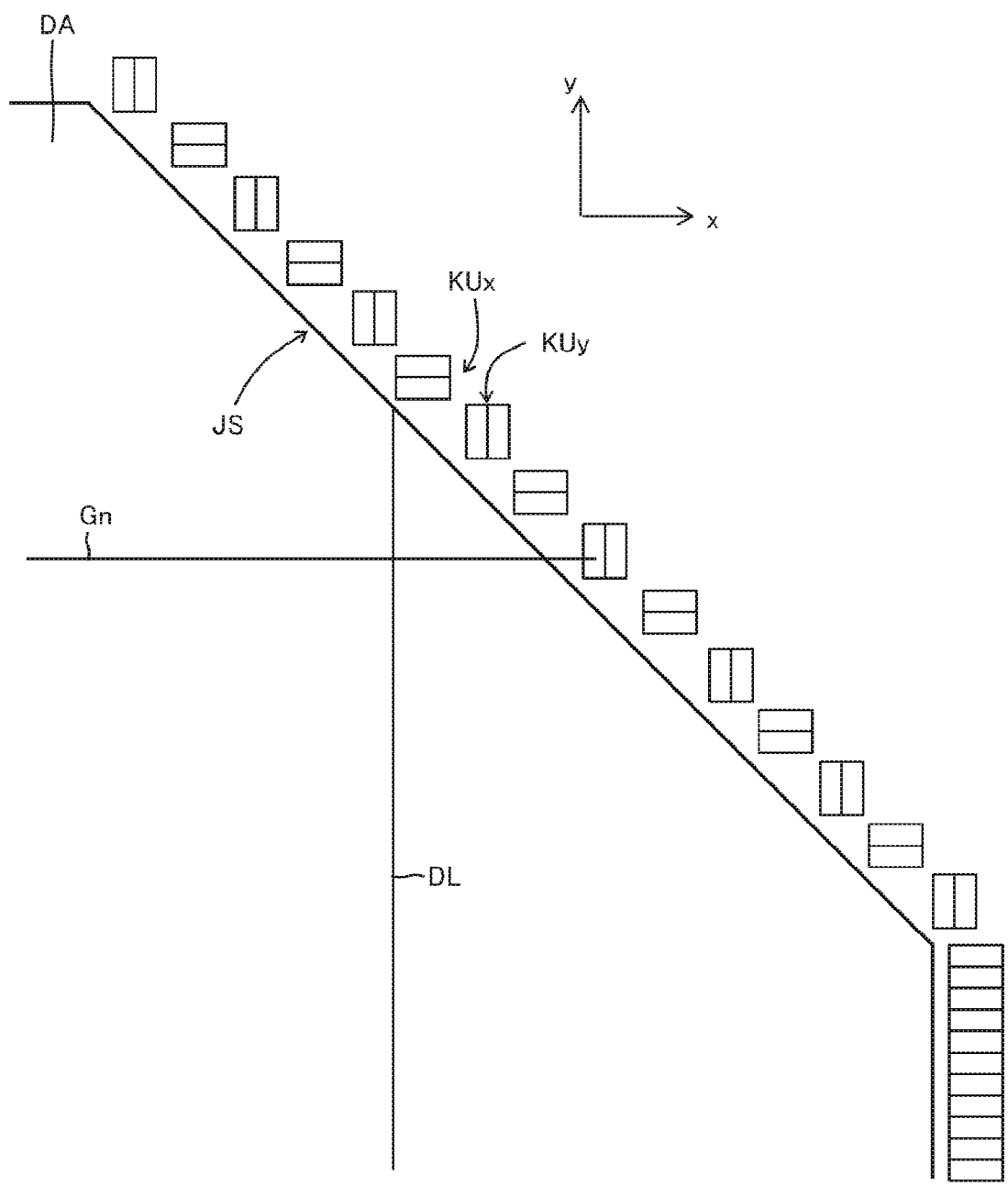
FIG. 10 is a plan view of another variation example of the corner portion of the display device.

FIG. 5 illustrates the special-shape portion JS as being shaped like an externally convex, curved line. The special-shape portion JS may alternatively be shaped like a line that is internally convex, curved as in FIG. 9 or that is oblique to the extension direction of the scan signal line, for example, oblique to the x-direction, as in FIG. 10. This structure still allows the circuit units KUx each including a plurality of first-type circuit blocks connected in the y-direction and the circuit units KUy each including a plurality of second-type circuit blocks connected in the x-direction to be arranged along and outside the special-shape portion JS.

The special-shape portion JS may include both curved-line-like segments and oblique-line-like segments and may include a plurality of curved-line-like segments with different curvatures.

Figure 11:
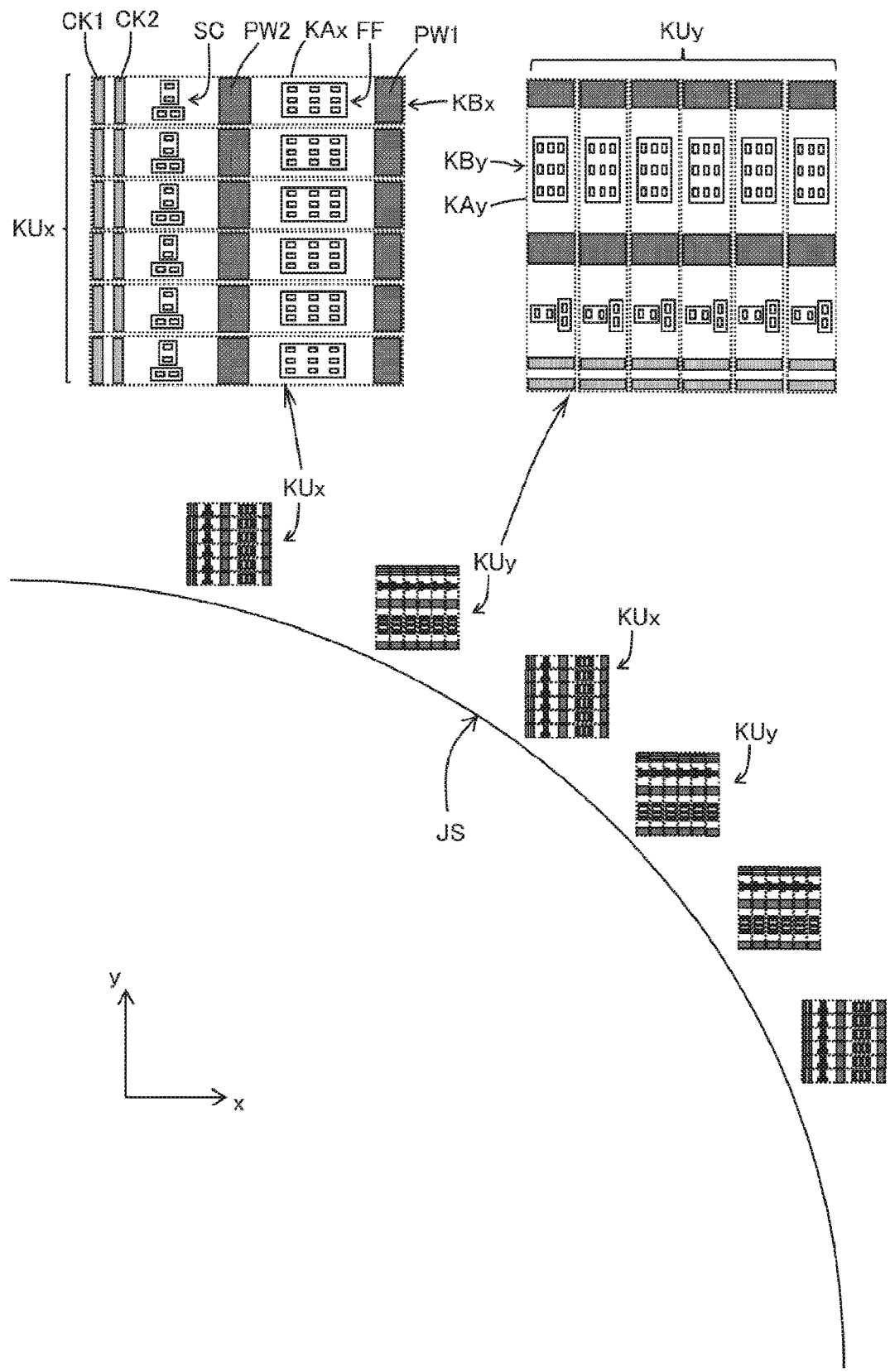
FIG. 11 is a plan view of a further variation example of the corner portion of the display device.

As shown in FIG. 11, the circuit unit KUx may include six first-type circuit blocks KBx arranged next to each other in the y-direction so as to form a square, the circuit unit KUy may include six second-type circuit blocks KBy arranged next to each other in the x-direction so as to form a square, and the circuit units KUx and KUy may be arranged alternately outside the special-shape portion JS.

Figure 12:
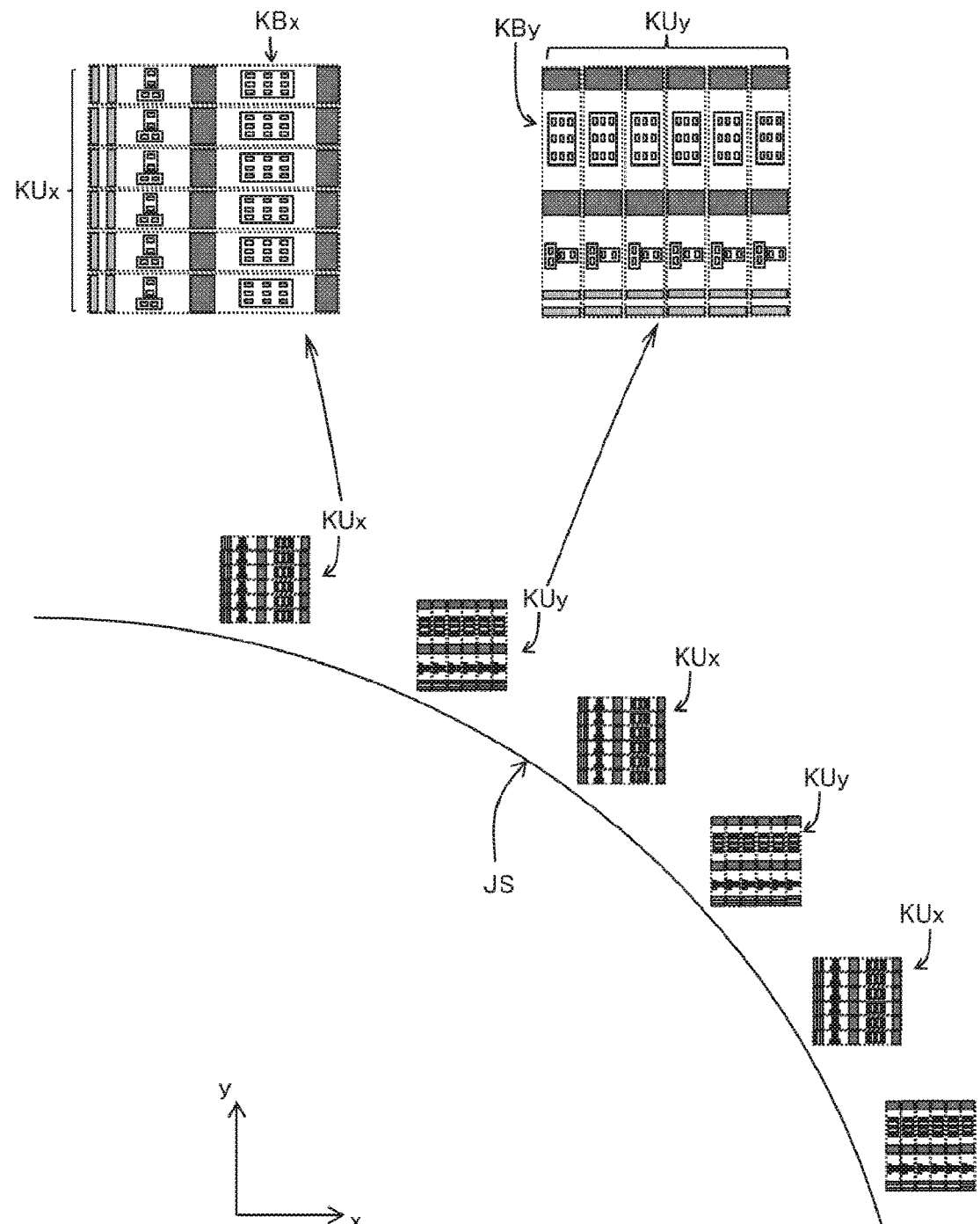
FIG. 12 is a plan view of still another variation example of the corner portion of the display device.

As another alternative, the circuit units KUx including the first-type circuit blocks KBx and the circuit units KUy including the second-type circuit blocks KBy may be disposed outside the special-shape portion JS as shown in FIG. 12, the second-type circuit block KBy being identical to the first-type circuit block KBx if the latter is rotated counterclockwise by 90° and then flipped in the left-right direction.

Figure 13:
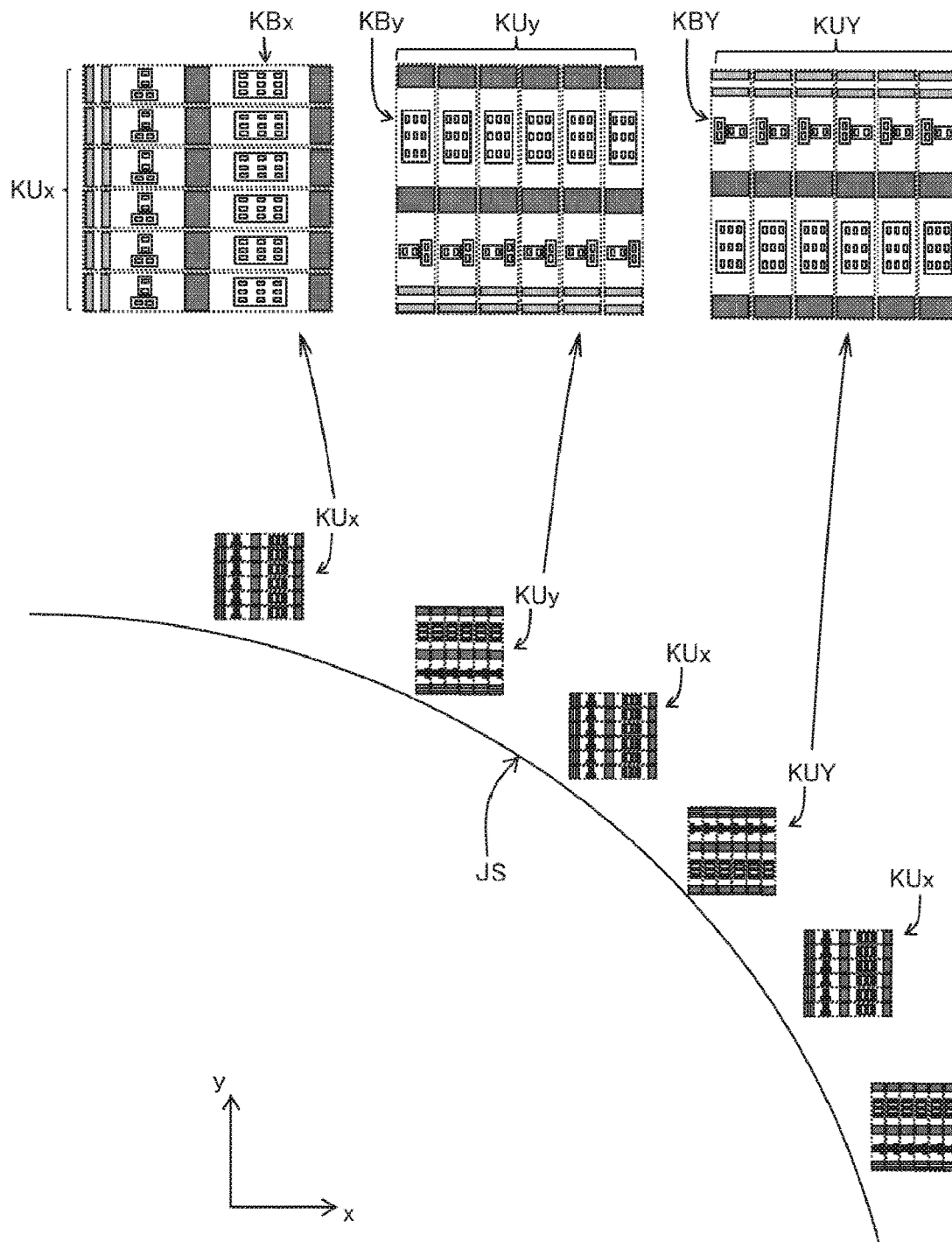
FIG. 13 is a plan view of yet another variation example of the corner portion of the display device.

As a further alternative, the circuit units KUx including the first-type circuit blocks KBx, the circuit units KUy including the second-type circuit blocks KBy, and circuit units KUY including second-type circuit blocks KBY may be disposed outside the special-shape portion JS as shown in FIG. 13, the second-type circuit block KBy being identical to the first-type circuit block KBx if the latter is rotated counterclockwise by 90° and the second-type circuit block KBY being identical to the first-type circuit block KBx if the latter is rotated clockwise by 90°.

FIGS. 5 to 13 illustrate a structure where: the unit circuits of the scan signal line driver are provided in the circuit blocks (the first-type circuit block and the second-type circuit block); and each of these unit circuits drives one scan signal line (outputs a scan signal to one scan signal line). This is however not the only possible implementation of the disclosure. Alternatively, the unit circuits of the light-emission signal line driver may be provided in the circuit blocks (the first-type circuit block and the second-type circuit block), and each of these unit circuits may drive one light-emission signal line (outputs a light-emission control signal to one light-emission signal line). As a further alternative, the unit circuits of the data signal line driver (time division driving driver) may be provided in the circuit blocks (the first-type circuit block and the second-type circuit block), and each of these unit circuits may drive a switch connected to one data signal line (e.g., an analog switch for controlling the ON/OFF of the data signal electrical potential in accordance with a gray level).

General Description

The display device in accordance with the present embodiment may include any electro-optical elements the luminance and transmittance of which are controlled through current. The display device in accordance with the present embodiment may be, for example, an organic EL (electroluminescence) display device including OLEDs (organic light-emitting diodes) as electro-optical elements, an inorganic EL display device including inorganic light-emitting diodes as electro-optical elements, or a QLED display device including QLEDs (quantum dot light-emitting diodes) as electro-optical elements.

Aspect 1

A display device including: a driver (e.g., a scan signal line driver, a light-emission signal line driver, or a data signal line driver) outside a display area; a special-shape portion on an edge of the display area, the special-shape portion being shaped like a line that is curved or oblique to an extension direction of signal lines in the display area; a plurality of first-type circuit blocks outside the special-shape portion, each of the first-type circuit blocks including a unit circuit for the driver in a rectangular region having a first side parallel to the extension direction and a second side perpendicular to, and shorter than, the first side; and a plurality of second-type circuit blocks outside the special-shape portion, each of the second-type circuit blocks including a unit circuit for the driver in a rectangular region obtained by rotating the previous rectangular region by 90°.

Aspect 2

The display device of, for example, aspect 1, wherein the unit circuits include a plurality of circuit elements, and the circuit elements in the second-type circuit blocks have a layout obtained by rotating by 90° a layout of the circuit elements in the first-type circuit blocks.

Aspect 3

The display device of, for example, aspect 1 or 2, further including, along the special-shape portion: circuit units each including the first-type circuit blocks arranged next to each other in a direction perpendicular to the extension direction; and circuit units each including the second-type circuit blocks arranged next to each other in the extension direction.

Aspect 4

The display device of, for example, aspect 3, wherein the first-type circuit blocks include either one or both of a clock signal line extending in the direction perpendicular to the extension direction and a power supply line extending in the direction perpendicular to the extension direction, and the second-type circuit blocks include either one or both of a clock signal line extending in the extension direction and a power supply line extending in the extension direction.

Aspect 5

The display device of, for example, aspect 3, wherein either the first-type circuit blocks or the second-type circuit blocks are arranged next to each other such that the circuit units have a square periphery.

Aspect 6

The display device of, for example, aspect 3, wherein those circuit units that are outside an end part of the special-shape portion include a different number of first-type circuit blocks or second-type circuit blocks than does those circuit units that are outside a middle part of the special-shape portion.

Aspect 7

The display device of, for example, aspect 3, wherein the special-shape portion is shaped like a curved line, those circuit units each of which includes N first-type circuit blocks or N second-type circuit blocks are disposed outside a part of the special-shape portion that has a tangent making an acute angle in a prescribed range with respect to the extension direction, and those circuit units each of which includes M first-type circuit blocks or M second-type circuit blocks are disposed outside a part of the special-shape portion that has a tangent making an acute angle outside the prescribed range with respect to the extension direction, where N and M are integers greater than or equal to 2, and M is greater than N.

Aspect 8

The display device of, for example, aspect 4, wherein the first-type circuit blocks and the second-type circuit blocks are connected by a connecting line routed like stairs.

Aspect 9

The display device of, for example, aspect 8, wherein the connecting line transmits a clock signal, a SET signal, a RESET signal, or a power supply voltage.

Aspect 10

The display device of, for example, aspect 4, further including, outside the special-shape portion, a main line shaped like a line that is curved or oblique to the extension direction, wherein the first-type circuit blocks and the second-type circuit blocks are connected to the main line.

Aspect 11

The display device of, for example, aspect 10, wherein the main line transmits a clock signal or a power supply voltage.

Aspect 12

The display device of, for example, aspect 10, wherein the first-type circuit blocks and the second-type circuit blocks are connected by a connecting line shaped like a line that is curved or oblique to the extension direction.

Aspect 13

The display device of, for example, aspect 3, wherein those circuit units each of which includes the first-type circuit blocks and those circuit units each of which includes the second-type circuit blocks are arranged alternately outside a part of the special-shape portion that has a tangent making an acute angle in a prescribed range with respect to the extension direction.

Aspect 14

The display device of, for example, aspect 5, wherein the circuit units each include six first-type circuit blocks or six second-type circuit blocks arranged next to each other.

Aspect 15

The display device of, for example, any one of aspects 1 to 14, wherein the unit circuits are for a scan signal line driver, a light-emission signal line driver, or a data signal line driver, and the signal lines are electrically connected to outputs of the unit circuits.

Aspect 16

The display device of, for example, aspect 15, wherein the signal lines are scan signal lines electrically connected to outputs of the unit circuits for the scan signal line driver.

Aspect 17

The display device of, for example, aspect 16, wherein the unit circuits correspond one-to-one to the scan signal lines.

Aspect 18

The display device of, for example, any one of aspects 1 to 17, wherein the special-shape portion is shaped like an externally convex, curved line.

Aspect 19

The display device of, for example, any one of aspects 1 to 18, wherein the second-type circuit blocks are obtained by rotating the first-type circuit blocks clockwise or counterclockwise by 90°.

Aspect 20

The display device of, for example, any one of aspects 1 to 19, wherein the unit circuits each include a flip-flop and an output circuit connected to the flip-flop, and the rectangular regions each have two parallel sides each specified by a clock signal line or a power supply line and two parallel sides sandwiching the flip-flop and the output circuit.

Aspect 21

The display device of, for example, any one of aspects 1 to 20, further including: light-emitting elements; and a subpixel circuit connected to the light-emitting elements, wherein the driver is provided in a same layer as the subpixel circuit.

Aspect 22

The display device of, for example, aspect 17, wherein the unit circuits supply a scan signal to the scan signal lines.

The invention claimed is:

1. A display device comprising:
   a driver outside a display area;
   a special-shape portion on an edge of the display area, the special-shape portion being shaped like a line that is curved or oblique to an extension direction of signal lines in the display area;
   a plurality of first-type circuit blocks outside the special-shape portion, each of the first-type circuit blocks including a unit circuit in the driver in a rectangular region having a first side parallel to the extension direction and a second side perpendicular to, and shorter than, the first side; and
   a plurality of second-type circuit blocks outside the special-shape portion, each of the second-type circuit blocks including a unit circuit for the driver in a rectangular region obtained by rotating the previous rectangular region by 90°.

2. The display device according to claim 1, wherein
the unit circuits include a plurality of circuit elements, and
the circuit elements in the second-type circuit blocks have a layout obtained by rotating by 90° a layout of the circuit elements in the first-type circuit blocks.

3. The display device according to claim 1, further comprising, along the special-shape portion:
circuit units each including the first-type circuit blocks arranged next to each other in a direction perpendicular to the extension direction; and
circuit units each including the second-type circuit blocks arranged next to each other in the extension direction.

4. The display device according to claim 3, wherein
the first-type circuit blocks include either one or both of a clock signal line extending in the direction perpendicular to the extension direction and a power supply line extending in the direction perpendicular to the extension direction, and
the second-type circuit blocks include either one or both of a clock signal line extending in the extension direction and a power supply line extending in the extension direction.

5. The display device according to claim 3, wherein either the first-type circuit blocks or the second-type circuit blocks are arranged next to each other such that the circuit units have a square periphery.

6. The display device according to claim 3, wherein those circuit units that are outside an end part of the special-shape portion include a different number of first-type circuit blocks or second-type circuit blocks than does those circuit units that are outside a middle part of the special-shape portion.

7. The display device according to claim 3, wherein
the special-shape portion is shaped like a curved line,
those circuit units each of which includes N first-type circuit blocks or N second-type circuit blocks are disposed outside a part of the special-shape portion that has a tangent making an acute angle in a prescribed range with respect to the extension direction, and
those circuit units each of which includes M first-type circuit blocks or M second-type circuit blocks are disposed outside a part of the special-shape portion that has a tangent making an acute angle outside the prescribed range with respect to the extension direction, where N and M are integers greater than or equal to 2, and M is greater than N.

8. The display device according to claim 4, wherein the first-type circuit blocks and the second-type circuit blocks are connected by a connecting line routed like stairs.

9. The display device according to claim 8, wherein the connecting line transmits a clock signal, a SET signal, a RESET signal, or a power supply voltage.

10. The display device according to claim 4, further comprising, outside the special-shape portion, a main line shaped like a line that is curved or oblique to the extension direction, wherein the first-type circuit blocks and the second-type circuit blocks are connected to the main line.

11. The display device according to claim 10, wherein the main line transmits a clock signal or a power supply voltage.

12. The display device according to claim 10, wherein the first-type circuit blocks and the second-type circuit blocks are connected by a connecting line shaped like a line that is curved or oblique to the extension direction.

13. The display device according to claim 3, wherein those circuit units each of which includes the first-type circuit blocks and those circuit units each of which includes the second-type circuit blocks are arranged alternately outside a part of the special-shape portion that has a tangent making an acute angle in a prescribed range with respect to the extension direction.

14. The display device according to claim 5, wherein the circuit units each include six first-type circuit blocks or six second-type circuit blocks arranged next to each other.

15. The display device according to claim 1, wherein
the unit circuits are for a scan signal line driver, a light-emission signal line driver, or a data signal line driver, and
the signal lines are electrically connected to outputs of the unit circuits.

16. The display device according to claim 15, wherein the signal lines are scan signal lines electrically connected to outputs of the unit circuits for the scan signal line driver.

17. The display device according to claim 1, wherein the special-shape portion is shaped like an externally convex, curved line.

18. The display device according to claim 1, wherein the second-type circuit blocks are obtained by rotating the first-type circuit blocks clockwise or counterclockwise by 90°.

19. The display device according to claim 1, wherein
the unit circuits each include a flip-flop and an output circuit connected to the flip-flop, and
the rectangular regions each have two parallel sides each specified by a clock signal line or a power supply line and two parallel sides sandwiching the flip-flop and the output circuit.

20. The display device according to claim 1, further comprising:
light-emitting elements; and
a subpixel circuit connected to the light-emitting elements, wherein
the driver is provided in a same layer as the subpixel circuit.

* * * * *